United States Patent [19]

Arrington et al.

[11] 3,806,843

[45] Apr. 23, 1974

[54] REMOTE MANUAL SWITCHING SYSTEM

[76] Inventors: William Lee Arrington, 29 Burke Dr.; David Lee Funston, 117 Tracy Ave., both of Batavia, N.Y. 14020; Paul Eshelman Lefevre, 7789 York Rd., Pavilion, N.Y. 14525; Lee Irving Merz, 4125 Connection Dr., Williamsville, N.Y. 14021

[22] Filed: Jan. 26, 1973

[21] Appl. No.: 326,830

[52] U.S. Cl. .......................... 334/8, 334/10, 334/15, 325/392, 354/466

[51] Int. Cl. .............................................. H03j 1/00

[58] Field of Search ........ 334/8, 9, 10, 15; 315/392, 315/393, 466

[56] References Cited

UNITED STATES PATENTS

| | | | |
|---|---|---|---|
| 3,573,684 | 4/1971 | Dickinson | 334/8 |
| 3,678,421 | 7/1972 | Ono | 334/15 |
| 3,179,907 | 4/1965 | Brand et al. | 334/8 X |
| 3,266,021 | 8/1966 | Druz et al. | 334/8 X |
| 3,044,016 | 7/1962 | Frihart et al. | 334/10 X |
| 3,201,726 | 8/1965 | Laschenski | 334/9X |

*Primary Examiner*—Archie R. Borchelt
*Assistant Examiner*—Saxfield Chatmon, Jr.
*Attorney, Agent, or Firm*—Norman J. O'Malley; Thomas H. Buffton; Cyril A. Krenzer

[57] ABSTRACT

A remote-manual switching system includes a plurality of banks of switches, first and second potential sources, a varactor tuner means, and a remote-manual switching means mechanically coupled to at least one of the plurality of banks of switches and having a solenoid responsive to a remote signal wherein the remote-manual switching means selectively couples the first and second potential sources and the varactor tuner means to the plurality of banks of switches in accordance with either energization of the solenoid by a remote signal or manual activation of at least one of the plurality of banks of switches.

10 Claims, 1 Drawing Figure

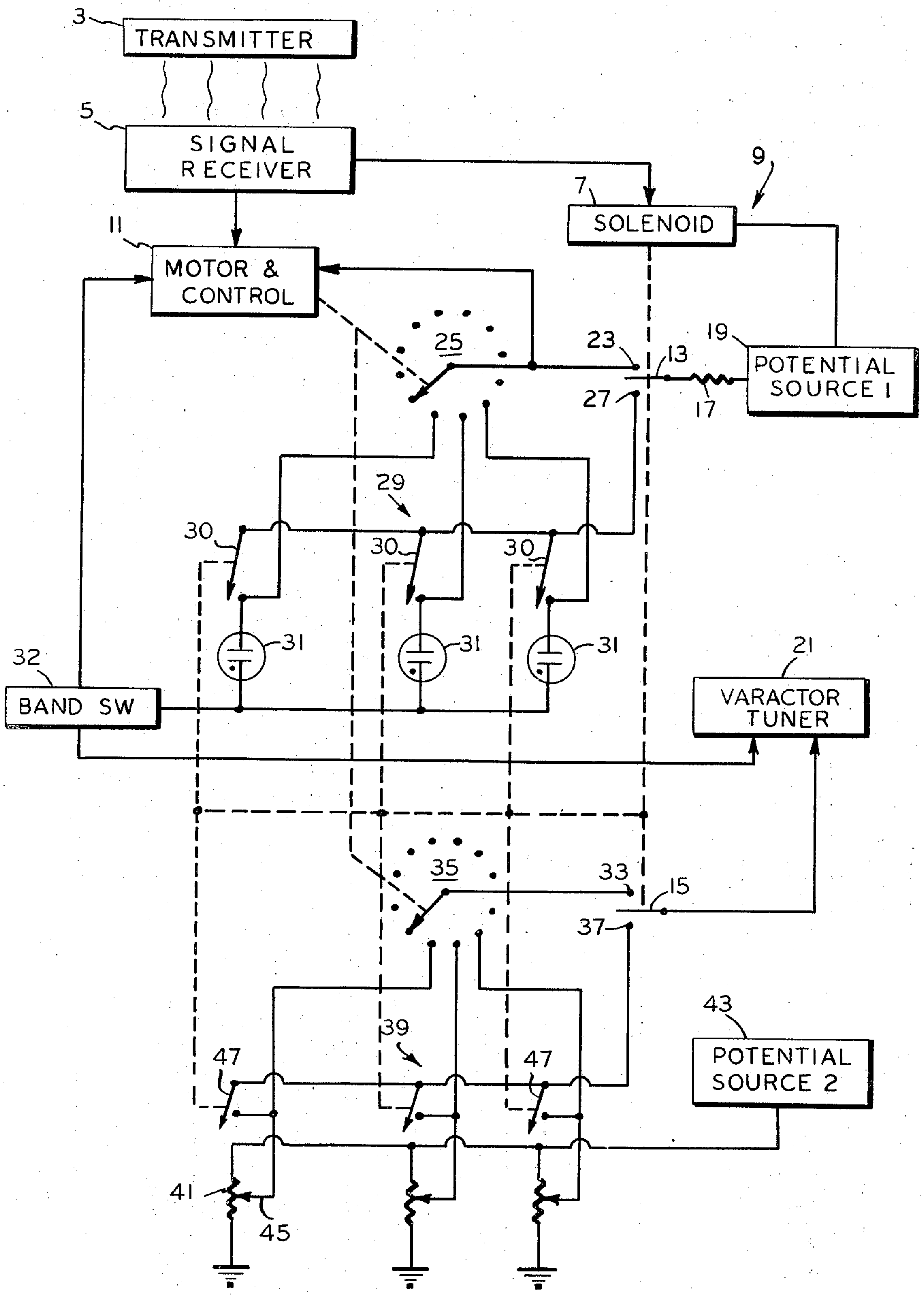
TRANSMITTER
SIGNAL RECEIVER
MOTOR & CONTROL
SOLENOID
POTENTIAL SOURCE 1
BAND SW
VARACTOR TUNER
POTENTIAL SOURCE 2
3
5
7
9
11
13
15
17
19
21
23
25
27
29
30
31
32
33
35
37
39
41
43
45
47

REMOTE MANUAL SWITCHING SYSTEM

CROSS-REFERENCE TO OTHER APPLICATIONS

An application entitled "Pushbutton Tuning System" filed concurrently herewith in the names of William Lee Arrington and Lee Riving Merz bearing application, Ser. No. 326,759 relates to a pushbutton type signal channel selector. Application entitled "Varactor Tuner Band Switching Circuitry" and "Varactor Tuner Band Switching and Signal Indicating Circuitry" bearing application Ser. No. 326,758 and application, Ser. No. 326,829 respectively and filed concurrently herewith relate and are assigned to the Assignee of the present application.

BACKGROUND OF THE INVENTION

Generally, the invention relates to a remote-manual switching system for a signal receiver having a varactor-type tuner and a pushbutton type of manual signal channel selector whereby compatible UHF and VHF signal channel selection is provided.

In the prior art, equal and compatible tuning of both VHF and UHF signal channels was not required by government regulation. Thus, most receivers employed a detent type of tuner channels 2–13 in the VHF band and a continuously variable type tuning for channels 14–83 in the UHF band.

Manual tuning for signals in the VHF band was usually effected by shifting a single knob from one detent position to another. The UHF band was usually tuned by rotating a variable capacitor to effect the signal channel selection. Moreover, remote tuning employed an ultrasonic tone transmitter whereby bi-directional motors in the receiver were activated and effected remote tuning in a manner similar to the above-described manual operation of the tuning controls.

However, the advent of equal and compatible tuning requirements for both VHF and UHF bands of signal channels has rendered the above-mentioned technique obsolete. As a result, there is a trend toward a pushbutton type of tuning wherein a cluster of pushbuttons is individually tuned to provide random selection of signal channels in either the VHF or UHF signal bands.

One known form of pushbutton type tuner with remote tuning capabilities is included in a color television receiver designated as the EO1 chassis manufactured by GTE Sylvania Incorporated. Herein, signal channel selection is effected manually by a pushbutton arrangement employing an override latching arrangement wherein pushing a button into an override position releases the previously engaged pushbutton. Moreover, the remote operation utilizes a motor to effect essentially the same operation utilizing substantially the same apparatus to effect both latching and un-latching.

Although the above-mentioned technique has been and still is extensively employed in numerous color television receivers, it has been found that there ae some applications wherein enhanced capabilities are desirable. More specifically, it has been found that a reduction in operational noise during both manual and remote operation is highly desirable in some receivers.

OBJECTS AND SUMMARY OF THE INVENTION

An object of the present invention is to provide a signal receiver having an enhanced remote-manual switching system. Another object of the invention is to provide an improved signal receiver having a remote-manual switching system utilizing separate banks of switches for remote and manual operations. Still another object of the invention is to provide an improved remote-manual switching system for a signal receiver wherein a remote-manual switch is activated by a remote signal or a manual signal channel selection.

These and other objects, advantages and capabilities are achieved in one aspect of the invention by a remote-manual switching system for a signal receiver wherein first and second potential sources and a varactor tuner are selectively coupled to a plurality of banks of switches by a remote-manual switching means activated by either remote or manual signal channel selection.

BRIEF DESCRIPTION OF THE DRAWING

The sole FIGURE is a functional diagram, in block and schematic form, of a remote-manual switching system for a signal receiver in accordance with a preferred embodiment of the invention.

DESCRIPTION OF THE PREFERRED EMBODIMENT

For a better understanding of the present invention, together with other and further objects, advantages and capabilities thereof, reference is made to the following disclosure and appended claims in connection with the accompanying drawing.

Referring to the drawing, a signal receiver having a remote control signal responsive circuit includes a remote-manual switching system. Generally, an ultrasonic tone transmitter 3 provides output signals which are intercepted by a signal receiver 5. The signal receiver 5 detects the intercepted signal and provides an output which is coupled to a solenoid 7 of a remote-manual switching means 9 and to a drive motor and control circuit 11.

The remote-manual switching means 9 includes first and second ganged switches, 13 and 15 respectively, with the first switch 13 coupled by a resistor 17 to a first potential source 19 and the second switch 15 coupled to a varactor tuner 21.

Also, the first switch 13 has a first contact 23 coupled to a first bank of switches 25 and a second contact 27 coupled to a second bank of parallel connected switches 29. The second bank of parallel connected switches 29 includes switches 30 for selectively coupling the second contact 27 to the first bank of switches 25 and, in turn, via neon bulbs 31 to bandswitching circuitry 32 connected to the drive motor and control circuit 11 and to the varactor tuner 21.

The second switch 15 of the remote-manual switching means 9 has a first contact 33 coupled to a third bank of switches 35 and a second contact 37 coupled to a fourth bank of parallel connected switches 39. Each one of the fourth bank of parallel connected switches 39 includes an alterable resistor 41 coupled to a second potential source 43 and to circuit ground. An adjustable arm 45 of each of the alterable resistors 41 is coupled to the third bank of switches 35 and selectively connected by a switch 47 to the second contact 37 of the second switch 15.

Also, the motor of the motor and control circuit 11 is mechanically coupled to the first bank of switches 25 and this first bank of switches 25 is ganged to the third bank of switches 35. Each of the switches 30 of the second bank of switches 29 is mechanically ganged to a corresponding one of the switches 47 of the fourth bank of switches 39. Moreover, all of the switches 30 and 47 of the second and fourth banks of switches 29 and 39 are mechanically coupled to one another and to the ganged first and second switches 13 and 15 of the remote-manual switching means 9.

Additionally, it should be noted that the switches 30 of the second bank of switches 29, 47 of the fourth bank of switches 39, and 13 and 15 of the remote-manual switching means 9 are all of the "slack-wire" type. As set forth in the previously mentioned disclosure entitled "Pushbutton Tuning System," the "slack-wire" type of switch includes an interconnecting wire which de-activates all switches except the one desired to be operational. In other words, the slack-wire mechanically insures activation of but one of the series of mechanically coupled switches 30, 47, and insures that switches 13 and 15 will be in the correct positional location.

As to operation of the remote-manual switching system, a signal from the remote transmitter 3 is intercepted and detected by the signal receiver 5. The signal receiver 5 provides an output potential which activates the solenoid 7 of the remote-manual switching means 9 and pulls each of the first and second switches 13 and 15 into contact with the first contacts 23 and 33 thereof and opens switches 29 and 39. Thus, the first potential source 19 is coupled via the resistor 17 and first switch 13 to the first bank of switches 25. Also, the varactor tuner 21 is coupled via the second switch 15 to the third bank of switches 35 and to the second potential source 43. Moreover the signal receiver 5 also provides an output potential which energizes the motor and control circuit 11 to effect mechanical activation of the first and third banks of switches 25 and 35.

As an example, activation of the remote transmitter 3, causes the signal receiver 5 to energize the solenoid 7 of the remote-manual switching means 9. Thereupon, a potential from the first potential source 19 is coupled via the first bank of switches 25 and a neon lamp 31 to the bandswitching circuitry 32 and, in turn to the varactor tuner 21 to provide selection of the correct signal band therein in accordance with the selected signal channel.

Also, the signal receiver 5 activates the motor and control circuit 11 which causes rotational movement from one signal channel to another of the first bank of switches 25. Moreover, potentials available at the bandswitching circuitry 32 are also applied to the motor and control circuitry 11 to insure continued rotation thereof intermediate the signal channels or contacts of the second bank of switches 29.

Additionally, a potential from the second potential source 43 is applied to the parallel coupled adjustable resistors 41. The adjustable arm 45 is programmed to provide a given potential in accordance with the signal channel selection and this potential is applied via the adjustable arm 45, third bank of switches 35, and second switch 15 of the remote-manual switching means 9 to the varactor tuner 21. Thus, a particular signal channel selection is effected. Moreover, this signal channel selection is shifted in accordance with movement of the ganged first and third banks of switches 25 and 35 as determined by the motor and control circuit 11 responsive to signals from the tone transmitter 3.

To return to manual operation, a particular signal channel is selected by manually activating any one of the parallel connected switches 30 of the second bank of switches 29. Also, the mechanical connection of the switches 30 extends to the first and second switches 13 and 15 of the remote-manual switching means 9. In other words, manual activation of one of the switches 30 is accompanied by activation of the first and second switches 13 and 15 and contact with the second contacts 27 and 37 respectively.

More specifically, manual activation of a particular one of the switches 30 of the second bank of switches 29 is accompanied by a shift of the first switch 13 to the contact 27. Thereupon, a potential from the first potential source 19 is applied via the resistor 17, contact 27, the particular switch 30, and the neon lamp 31 to the band switching means 32. The band switching means 32 selects a particular frequency band as represented by a potential or potentials applied to the varactor tuner 21. Moreover, switch 30 also provides a potential from potential source 19 which energizes the motor and control circuit 11 in a manner such that the second bank of switches 25 is automatically altered to correspond with or track the particular signal channel or manual switch 30 selected.

At the same time, one of the switches 47 corresponding to the selected channel and switch 30 and "ganged" thereto is activated. Thereupon, a potential from the second potential source 43 and representative of the potential required to effect selection of the desired channel by the varactor tuner means 21 is coupled via one of the alterable resistors 41, the adjustable arm 45, the selected switch 47 of the fourth bank of switches 39, and the contact 37 of the second switch 15 to the varactor tuner means 21.

Thus, there has been provided an enhanced signal receiver having a unique remote-manual switching system. The system includes a separate first and second potential sources for providing potentials for effecting selection of both frequency band and signal channel in a varactor-type tuner.

Also, the remote-manual switching system provides a plurality of banks of switches with separate banks of switches for remote operation and for manual operation. Provision is made for manual activation of one signal channel accompanied by de-activation of the other signal channels and an automatic shift from the remote to the manual operating position of a remote-manual switching means. Moreover, the multiple banks of switches in conjunction with remote and manual operation limited to particular ones of the multiple switch banks, and a "slack-wire" type of automatic operation greatly reduce undesired noise and provide a capability unattainable in any other known form of remote-manual switching system.

While there has been shown and described what is at present considered the preferred embodiment of the invention, it will be obvious to those skilled in the art that various changes and modifications may be made therein without departing from the scope of the invention as defined by the appended claims.

What is claimed is:

1. In a signal receiver having a remote control signal response circuit, a remote-manual switching system comprising: varactor turner means;

first and second potential sources;

first, second, thrid, and fourth banks of switches; and remote-manual switching means mechanically coupled to at least one of said banks of switches, said switching means selectively coupling said second and fourth banks of switches intermediate each of said first and said second potential sources and said varactor tuner means in response to manual selection of a signal channel and selectively coupling said first and third banks of switches intermediate each of said first and said second potential sources and said varactor tuner means in response to energization by a remote control signal.

2. A remote-manual switching system of claim 1 including bandswitching circuitry coupled to said varactor tuner means and to said first and second banks of switches connected for selective coupling to said first potential source.

3. The remote-manual switching system of claim 1 wherein said remote-manual switching means includes a first switch for selectively coupling said first potential source to one of said first and second banks of switches connected to said varactor tuner means and a second switch for selectively coupling said varactor tuner means to one of said third and fourth banks of switches connected to said second potential source.

4. The remote-manual switching system of claim 1 wherein said plurality of banks of switches includes first and second banks of switches each coupled to said varactor tuner means and selectively coupled to said first potential source by said remote-manual switching means.

5. The remote-manual switching system of claim 1 wherein said plurality of banks of switches includes third and fourth banks of switches each coupled to said second potential source and selectively coupled to said varactor tuner means by said remote-manual switching means.

6. The remote-manual switching system of claim 3 wherein said first and second switches of said remote-manual switching means are mechanically connected to one another and to at least one of said second and fourth banks of switches.

7. A remote-manual switching system for a signal receiver comprising:

first and second potential sources;

varactor tuner means;

motor and control means responsive to signals from a remote signal source;

first and third banks of switches coupled to one another and to said motor and control means;

second and fourth banks of switches coupled to one another; and remote-manual switching means including first and second switches mechanically connected to one another and to said second and fourth banks of switches, said switching means responsive to signals from a remote signal source for coupling said first and third banks of switches intermediate said varactor tuner and said first and second potential sources respectively and to manual selection of a signal channel for coupling said second and fourth banks of switches intermediate said varactor tuner and said first and second potential sources whereby channel band selection and indication as well as signal channel tuning potentials for said varactor tuner are effected.

8. The remote-manual switching system of claim 7 including band switching means coupling said first and second banks of switches to said varactor tuner and to said motor and control means to effect tracking of said first and third banks of switches in accordance with selected manual activation of said second and fourth banks of switches.

9. The remote-manual switching system of claim 7 wherein said first and second banks of switches includes means for providing a selected signal channel indication.

10. The remote-manual switching system of claim 7 wherein said third and fourth banks of switches includes means for providing selected signal channel tuning potentials to said varactor tuner.

* * * * *

UNITED STATES PATENT OFFICE

CERTIFICATE OF CORRECTION

PATENT NO. : 3,806,843

DATED : April 23, 1974

INVENTOR(S) : William Lee Arrington, David L. Funston, Paul E. Lefevre Lee I. Merz It is certified that error appears in the above-identified patent and that said Letters Patent are hereby corrected as shown below:

Please add the following:

[73] Assignee: GTE Sylvania Incorporated, Stamford, Conn.

Signed and Sealed this

*third* Day of *February 1976*

[SEAL]

*Attest:*

RUTH C. MASON
*Attesting Officer*

C. MARSHALL DANN
*Commissioner of Patents and Trademarks*